(12) United States Patent
Eda

(10) Patent No.: US 7,936,075 B2
(45) Date of Patent: May 3, 2011

(54) SEMICONDUCTOR DEVICE AND SEMICONDUCTOR DEVICE MANUFACTURING METHOD

(75) Inventor: Tsuyoshi Eda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 14 days.

(21) Appl. No.: 12/379,364

(22) Filed: Feb. 19, 2009

(65) Prior Publication Data

US 2009/0224375 A1 Sep. 10, 2009

(30) Foreign Application Priority Data

Mar. 5, 2008 (JP) ................................ 2008-054528

(51) Int. Cl.
*H01L 23/48* (2006.01)
(52) U.S. Cl. ........ 257/783; 257/779; 257/778; 257/737; 257/643
(58) Field of Classification Search .................. 257/643, 257/779, 778, 737, E23
See application file for complete search history.

(56) References Cited

U.S. PATENT DOCUMENTS

| 6,656,826 B2 | 12/2003 | Ishimaru | |
|---|---|---|---|
| 2002/0096764 A1* | 7/2002 | Huang | .......................... 257/737 |

FOREIGN PATENT DOCUMENTS

| JP | 03268393 A | * 11/1991 |
| JP | 06-177134 | 6/1994 |
| JP | 2000-183089 A | 6/2000 |
| JP | 2002-110799 A | 4/2002 |

* cited by examiner

*Primary Examiner* — Leonardo Andújar
(74) *Attorney, Agent, or Firm* — Foley & Lardner LLP

(57) ABSTRACT

The present invention provides a semiconductor device for which thermal stress at mounting is reduced and a reduction in reliability with regard to moisture absorption is prevented. The semiconductor device includes a uppermost metal layer 12, a solder bump 17, metals 15 and 16 which connect an uppermost metal layer 12 and the solder bump 17, and, a polyimide multilayer 14 having formed therein an opening 14x in which the metals 15 and 16 are provided. The polyimide multilayer 14 includes a first polyimide layer 14A and a second polyimide layer 14B formed on the first polyimide layer 14A. The second polyimide layer 14B is softer than the first polyimide layer 14A. A thermal stress at mounting is reduced by the second polyimide layer 14B. Since the first polyimide layer 14A has a higher strength than the second polyimide layer 14B, even if cracking occurs in the second polyimide layer 14B, the cracks are prevented from developing in the first polyimide layer 14A.

4 Claims, 6 Drawing Sheets

SEMICONDUCTOR DEVICE AND SEMICONDUCTOR DEVICE MANUFACTURING METHOD

BACKGROUND OF THE INVENTION

1. Field of the Invention

The present invention relates to a semiconductor device and, in particular, to a bump structure of the semiconductor device.

2. Description of the Related Art

In semiconductor devices mounted on wiring substrates by flip chip bonding, a protruding electrode called a bump is formed on an electrode on the surface of the semiconductor device.

Japanese Patent Laid-Open No. H6-177134 discloses a technique for reducing the heat stress generated in the bump by the heat cycle at mounting. A resin layer, such as a polyimide layer, is formed between a terminal electrode on the wafer and a barrier metal layer which covers the terminal electrode. Deformation of the resin layer reduces the thermal stress.

Japanese Patent Laid-Open No. 2000-183089 relates to a bump structure of a semiconductor device and discloses a technique for constructing an insulation layer with two polyimide layers which covers a surface of the semiconductor device. By constructing the insulation layer with the two polyimide layers, the insulation layer can be made thick, and columnar terminals formed in opening portions of the insulation layer can be lengthened.

Japanese Patent Laid-Open No. 2002-110799 also discloses a bump structure of a semiconductor device.

SUMMARY OF THE INVENTION

According to investigations by the inventor, if the polyimide layer provided in the semiconductor devices to reduce the thermal stress during mounting is made softer, the strength of the polyimide layer drops. When the strength of the polyimide layer is low, there is risk, when the polyimide layer is in contact with the underfill resin, that the cracks will form through the entire thickness of the polyimide layer. Here, the underfill resin is used to fill the gap between the semiconductor device and the wiring substrate when the semiconductor device is mounted on the wiring substrate by flip chip bonding. A polyimide layer which has a crack formed through an entire thickness thereof has reduced reliability with regard to moisture absorption. A semiconductor device which offers a reduction in thermal stress at mounting and prevention of a reduction in reliability with regard to moisture resistance is therefore desired.

The following describes solutions to the problems denoting the construction elements with the numerals used in the "Detailed Description of the Preferred Embodiments". The numerals are added here to clarify the correspondences between the description in the "Claims" and that in the "Detailed Description of the Preferred Embodiments". Note, however, that the numerals should not be used to interpret to the technical scope of the present invention recorded in the claims.

The semiconductor device according to the present invention includes uppermost metal layer (12), a solder bump (17), metals (15 and 16) which connect the uppermost metal layer (12) and the solder bump (17), and a polyimide multilayer (14) having formed therein an opening portion (14x) in which the metal (15, 16) is provided. The polyimide multilayer (14) includes a first polyimide layer (14A) and a second polyimide layer (14B) formed on the first polyimide layer (14A). The second polyimide layer (14B) is softer than the first polyimide layer (14A).

Thermal stress at mounting is reduced by the soft second polyimide layer (14B). Since the first polyimide layer (14A) has a higher strength than the second polyimide layer (14B), even if cracking occurs in the second polyimide layer (14B), the cracks are prevented from developing in the first polyimide layer (14A).

The semiconductor device manufacturing method according to the present invention includes a step of forming a polyimide multilayer having formed therein an opening portion (14x) in which is provided metals (15 and 16) which connect the uppermost metal layer (12) and the solder bump (17). The step of forming the polyimide multilayer (14) includes: a sub-step of forming a first coating layer (41) of a coating agent which includes a polyimide precursor; a sub-step of baking the first coating layer (41) to form the first polyimide layer (14A); a sub-step of coating the coating agent on the first polyimide layer (14A) to form the second coating layer (42); and a sub-step of baking the second coating layer (42) to form the second polyimide layer (14B).

The first coating layer (41) is baked in the sub-step to form the first polyimide layer (14A) and baked again in the sub-step to form the second polyimide layer (14B). The second coating layer (42) is baked in the sub-step to form the second polyimide layer (14B). Since, in the semiconductor device manufactured using the semiconductor device manufacturing method according to the present invention, the same coating agent is used to form both the first coating layer (41) and the second coating layer (42), the second polyimide layer (14B) is softer than the first polyimide layer (14A) and the first polyimide layer (14A) has a higher strength than the second polyimide layer (14B). Hence, the thermal stress at mounting is reduced by the second polyimide layer (14B) and cracks which occur in the second polyimide layer (14B) are prevented from developing in the first polyimide layer (14A).

According to the present invention, a semiconductor device is provided for which thermal stress at mounting is reduced and a reduction in reliability with regard to moisture absorption is prevented.

DETAILED DESCRIPTION OF THE PREFERRED EMBODIMENTS

In order to aid understanding of the present invention, a semiconductor device relating to the present invention is described before describing the preferred embodiments of the semiconductor device and semiconductor device manufacturing method according to the present invention.

Figure 1:
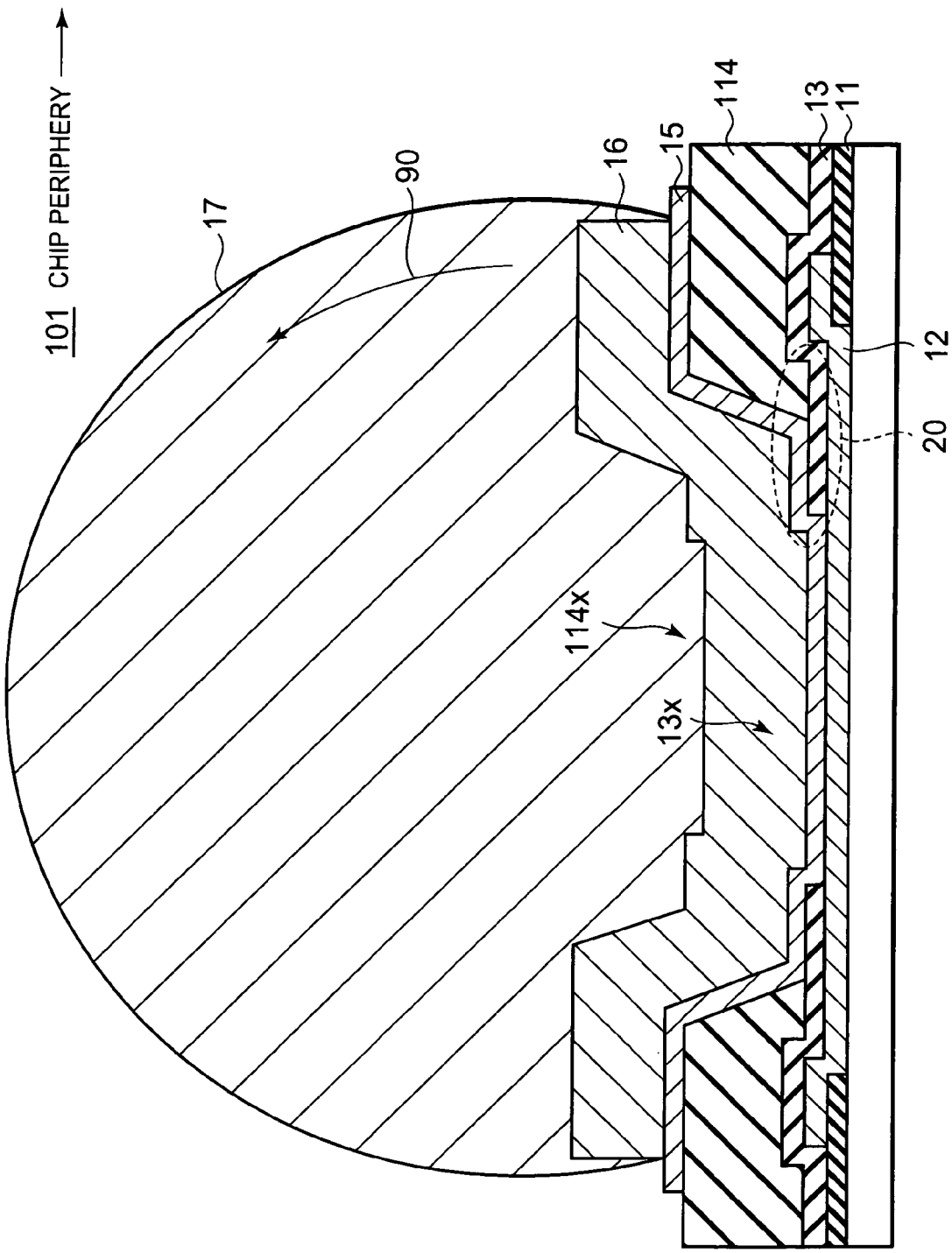
FIG. 1 is a cross-sectional view of a semiconductor device relating to the present invention.

FIG. 1 shows a semiconductor device 101 relating to the present invention. The semiconductor device 101 is sometimes called a "chip". The semiconductor device 101 includes a cover film 11, an uppermost metal layer 12, a cover film 13, a polyimide layer 114, a barrier metal 15, underbump metal 16 and a solder bump 17. The uppermost metal layer 12 is formed on the cover film 11, which is provided as an insulation layer, and is connected to wiring in a layer below the cover film 11. The uppermost metal layer 12 may be a terminal electrode. The cover film 13, which is an insulation layer, includes an opening portion 13x and is formed on the uppermost metal layer 12. The cover film 13 is, for example, a passivation film such as PSG (Phospho-Silicate-Glass) film or silicon oxide film. The polyimide layer 114, which is an insulation film, has an opening portion 114x and is formed on the cover film 13. The barrier metal 15 is formed on the polyimide layer 114 so that a portion of the barrier metal 15 is provided in the opening portions 13x and 114x. The underbump metal 16 is formed on the barrier metal 15 so that a portion of underbump metal 16 is provided in the opening portion 114x. The underbump metal 16 is thicker than the barrier metal 15. The solder bump 17 is formed on the underbump metal 16. The solder bump 17 is electrically connected to the uppermost metal layer 12 via the barrier metal 15 and the underbump metal 16 so as to be at the same potential as the uppermost metal layer 12.

The solder bump 17 is provided at a peripheral portion of the semiconductor device 101. When the semiconductor device 101 is being mounted on the wiring substrate by flip chip bonding, differences in the rate of thermal expansion between the semiconductor device 101 and the wiring substrate cause a stress in the solder bump 17 which acts to pull the underbump metal 16 diagonally upwards as shown by the arrow 90. As a result of the stress, a force acts on the underbump metal 16 and is transmitted via the polyimide layer 114 to a breakage occurring region 20 in proximity to the opening portion 114x. As a result, the cover film 13 breaks in the breakage occurring region 20.

Figure 2:
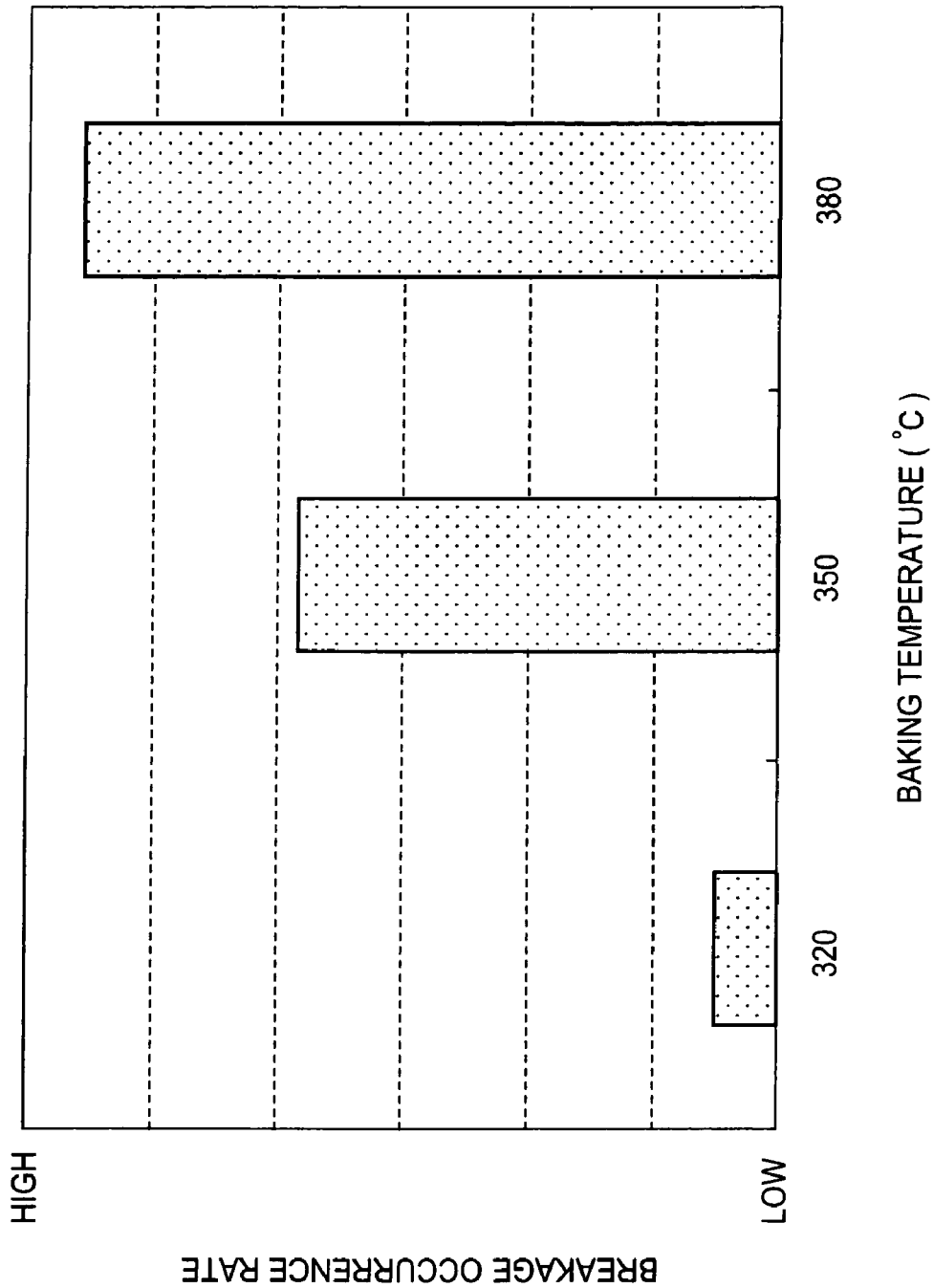
FIG. 2 is graph showing a relationship between a baking temperature when a polyimide layer is formed and a rate of occurrence of breakage.

To prevent this breakage, a technique may be considered by which the polyimide layer 114 is allowed to extend to reduce the thermal stress, which is indicated by the arrow 90, at the mounting. FIG. 2 shows a relationship between a baking temperature and a breakage occurrence rate when forming the polyimide layer 114. As shown in FIG. 2, the breakage occurrence rate when the baking temperature is 350° C. is lower than the breakage occurrence rate when the baking temperature is 380° C. Moreover, the breakage occurrence rate when the baking temperature is 320° C. is lower than the breakage occurrence rate when the baking temperature is 350° C. In short, lower baking temperatures resulted in lower breakage occurrence rates. This is because a lower baking temperature results in the formation of a softer polyimide layer 114.

However, when the polyimide layer is made softer, the strength of the polyimide layer is reduced. When the strength of the polyimide layer 114 is low, there is a risk that cracks will form across the entire thickness of the polyimide layer 114 when underfill resin, which is used at mounting to fill the gap between the semiconductor device 101 and the wiring substrate, makes contact with the polyimide layer 114. A polyimide layer 114 having a crack formed across its entire thickness has reduced reliability with regard to moisture absorption.

The following describes a preferred embodiment for implementing a semiconductor device and associated manufacturing method according to the present invention with reference to the accompanying drawings.

First Embodiment

Figure 3:
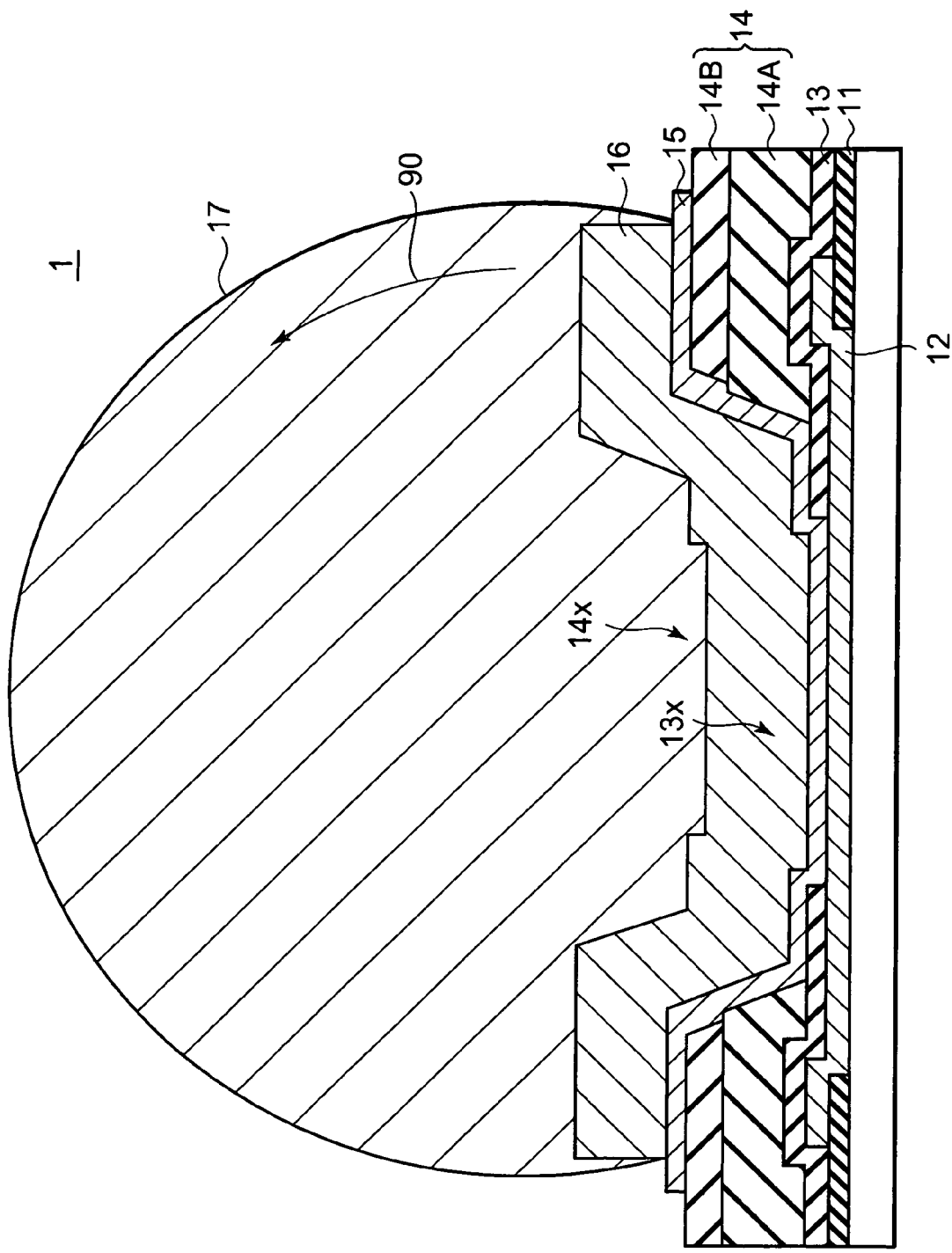
FIG. 3 is a cross-sectional view of a semiconductor device of a first embodiment of the present invention.

FIG. 3 shows a semiconductor device 1 of a first embodiment of the present invention. The semiconductor device 1 formed in the same way as the semiconductor device 101 except in that the polyimide multilayer 14 is provided in place of the polyimide layer 114. The polyimide layer 14, which is an insulation layer, has an opening portion 14x and is formed on the cover film 13. The barrier metal 15 is formed on the polyimide multilayer 14 so that a portion of the barrier metal 15 is provided in the opening portions 13x and 14x. The underbump metal 16 is formed on the barrier metal 15 so that a portion of the underbump metal 16 is provided in the opening portion 14x. The solder bump 17 is electrically connected to the uppermost metal layer 12 via the barrier metal 15 and the underbump metal 16 so as to be at the same potential as the uppermost metal layer 12. The solder bump 17 is connected to the uppermost metal layer 12 via the metal (15 and 16) provided in the opening portion 14x.

The polyimide multilayer 14 includes a first polyimide layer 14A formed on the cover film 13 and a second polyimide layer 14B formed on the first polyimide layer 14A. The second polyimide layer 14B is provided on the solder bump 17 side of the first polyimide layer 14A. The second polyimide layer 14B is softer than the first polyimide layer 14A. For instance, the second polyimide layer 14B may have a lower elastic modulus than the first polyimide layer 14A. When the elastic modulus is small, a large amount distortion takes place even when the stress is small.

Hence, the thermal stress at mounting is reduced by the extension of the second polyimide layer 14B, and breakage of the cover film 13 is prevented. Further, since first polyimide layer 14A has a higher strength than the second polyimide layer 14B, even if cracking occurs in the second polyimide layer 14B which is in contact with the underfill resin, cracks are prevented from developing in the first polyimide layer 14A. Since cracks spanning the entire width of the polyimide multilayer 14 are not formed, a reduction in reliability with regard to the moisture absorption of the polyimide multilayer 14 is prevented.

The following describes a manufacturing method for the semiconductor device 1.

Figure 4A:
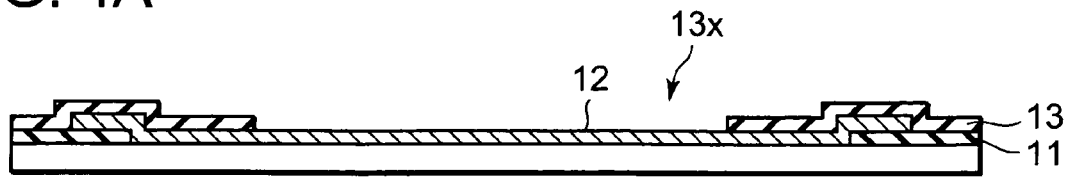
FIG. 4A is a cross-sectional view of a semiconductor wafer prior to forming a first coating layer in a semiconductor device manufacturing method according to the first embodiment.

As seen in FIG. 4A, after the uppermost metal layer 12 has been fabricated, the cover film 13 is grown. Thereafter, an opening portion 13x is formed in the cover film 13 for an underbump metal via by pattering with a photoresist.

Figure 4B:
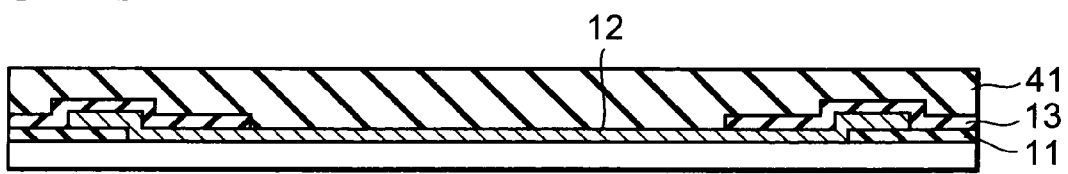
FIG. 4B is cross-sectional view of the semiconductor wafer after formation of a first coating layer.

As seen in FIG. 4B, a coating agent including a polyimide precursor is applied to the cover film 13 to form a first coating layer 41.

Figure 4C:
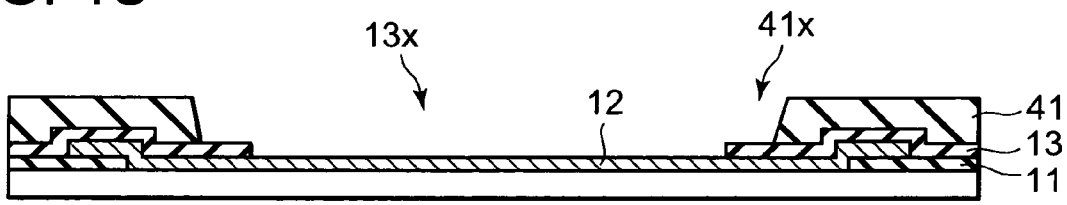
FIG. 4C is a cross-sectional view of the semiconductor wafer after formation of an opening portion in the first coating layer.

As seen in FIG. 4C, patterning is performed to form an opening portion 41x in the first coating layer 41. The opening portion 41x is formed so as to communicate with the opening portion 13x. Thereafter, the first coating layer 41 is baked under conditions of baking temperature X1 and bake time T1 to form the first polyimide layer 14A.

Figure 4D:
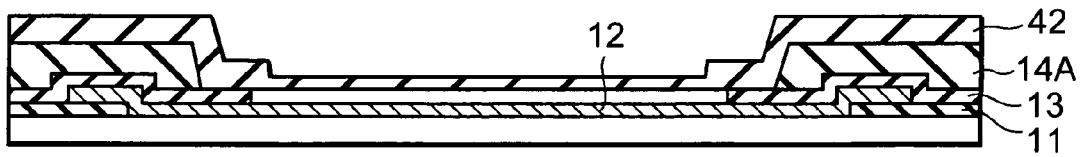
FIG. 4D is cross-sectional view of the semiconductor wafer after formation of a second coating layer.

As seen in FIG. 4D, a coating agent of the same composition as the coating agent used for the first coating layer 41 is applied to the first polyimide layer 14A to form a second coating layer 42.

Figure 4E:
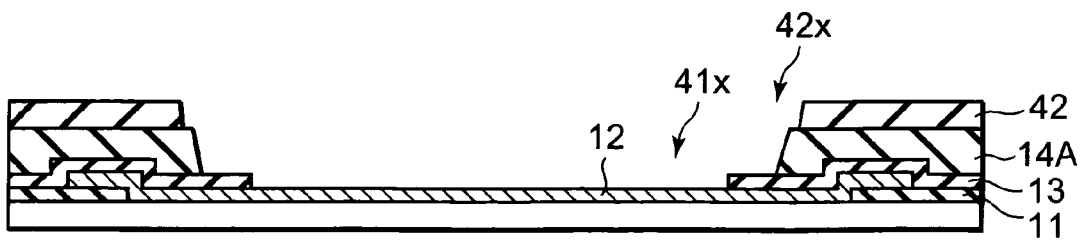
FIG. 4E is a cross-sectional view of the semiconductor wafer after formation of an opening portion in the second coating layer.

As seen in FIG. 4E, patterning is performed to form an opening portion 42x in the second coating layer 42. The opening portion 42x is formed so as to communicate with the opening portion 41x. Thereafter, the second coating layer 42 is baked under conditions of baking temperature X2 and bake time T2 to form the second polyimide layer 14B. The opening portion 14x includes the opening portions 41x and 42x.

Thereafter, the barrier metal 15 is formed on the second polyimide layer 14B so that a portion of the barrier metal 15 is provided in the opening portions 13x and 14x. The underbump metal 16 is formed on the barrier metal 15 so that a portion of the underbump metal 16 is provided in the opening portion 14x. The solder bump 17 is formed on the underbump metal 16.

As the baking temperature increases, the hardness and strength of the formed polyimide layer increase. As length of the baking time increases, the hardness of the formed polyimide layer increases and the strength increases.

In this embodiment, the first coating layer 41 is baked under the conditions of the baking temperature X1 and the bake time T1, and again under the conditions of the baking temperature X2 and the bake time T2. The second coating layer 42, on the other hand, is baked under the conditions of the baking temperature X2 and the bake time T2. Hence, the second polyimide layer 14B is softer than the first polyimide layer 14A, and the first polyimide layer 14A has a higher strength than the second polyimide layer 14B.

By making the baking temperature X1 higher than the baking temperature X2, the second polyimide layer 14B is formed to be softer than the first polyimide layer 14A. For instance, if the baking temperature X1 is set to 380° C., the baking temperature X2 may be set to 320° C. or 350° C.

By making the bake time T1 longer than the bake time T2, the second polyimide layer 14B is made softer than the first polyimide layer 14A.

Second Embodiment

Figure 5:
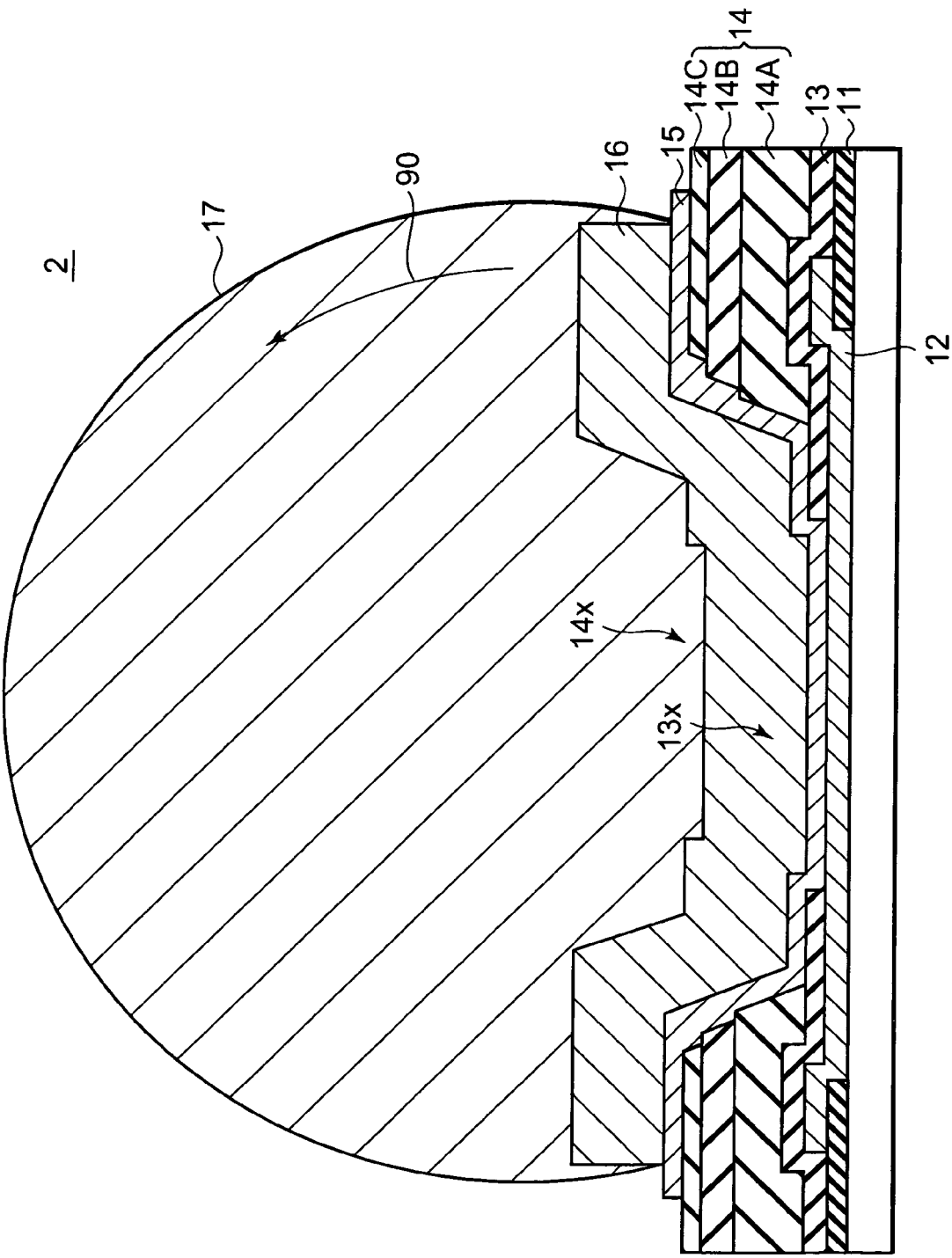
FIG. 5 is a cross-sectional view of a semiconductor device of a second embodiment of the present invention.

FIG. 5 shows a semiconductor device 2 of a second embodiment of the present invention. The semiconductor device 2 is formed in the same way as the semiconductor device 1 except in that the polyimide multilayer 14 includes a third polyimide layer 14C in addition to the first polyimide layer 14A and the second polyimide layer 14B. The third polyimide layer 14C is formed on the second polyimide layer 14B and is provided on the solder bump 17 side of the second polyimide layer 14B. The third polyimide layer 14C is softer than the second polyimide layer 14B. For instance, the third polyimide layer 14C may have a lower elastic modulus than the second polyimide layer 14B.

Hence, the thermal stress at mounting is reduced by extension of the third polyimide layer 14C or by extension of the third polyimide layer 14C and the second polyimide layer 14B, and breakage of the cover film 13 is prevented. Further, since the second polyimide layer 14B has a higher strength than the third polyimide layer 14C and the first polyimide layer 14A has a higher strength than the second polyimide layer 14B, even if cracking occurs in the third polyimide layer 14C which makes contact with the underfill resin, cracks are prevented from developing into the first polyimide layer 14A. Since cracks spanning the entire width of the polyimide multilayer 14 are not formed, a reduction in reliability with regard to the moisture absorption of the polyimide multilayer 14 is prevented.

The following describes a manufacturing method for the semiconductor device 2.

The semiconductor device 2 is manufactured in the same way as the semiconductor device 1 up to the formation of the second polyimide layer 14B by baking the second coating layer 42.

Figure 6A:
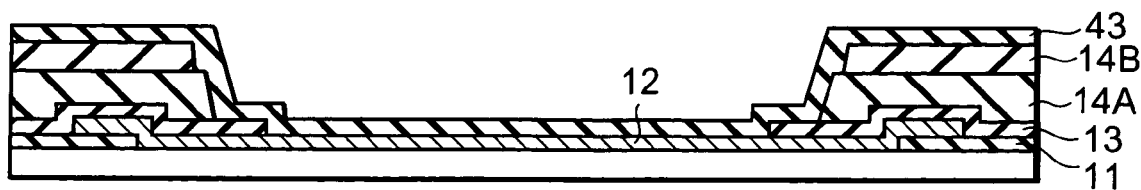
FIG. 6A is a cross-sectional view of a semiconductor wafer after formation of a third coating layer in a semiconductor device manufacturing method according to the second embodiment.

As seen in FIG. 6A, a coating agent of the same composition as the coating agent used for the first coating layer 41 is applied to the second polyimide layer 14B to form the third coating layer 43.

Figure 6B:
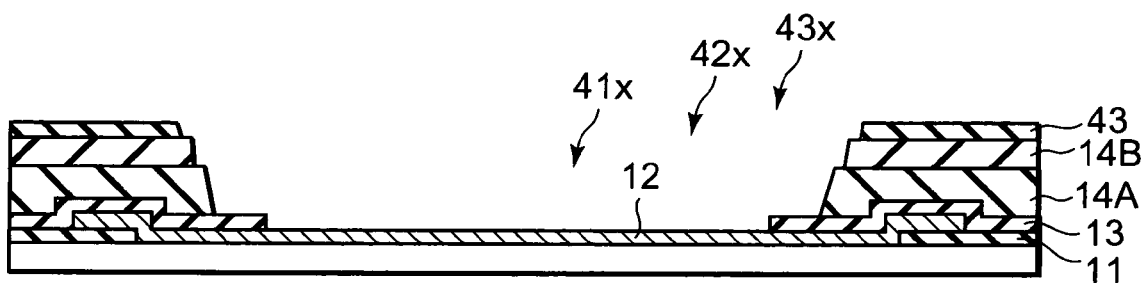
FIG. 6B is cross-sectional view of the semiconductor wafer after formation of an opening portion in the third coating layer.

As seen in FIG. 6B, patterning is performed to form an opening portion 43x in the third coating layer 43. The opening portion 43x is formed so as to communicate with the opening portion 42x. Thereafter, the third coating layer 43 is baked under conditions of baking temperature X3 and bake time T3 to form the third polyimide layer 14C. The opening portion 14x includes the opening portions 41x and 43x.

Thereafter, the barrier metal 15 is formed on the third polyimide layer 14C so that a portion of the barrier metal 15 is provided in the opening portions 13x and 14x. The underbump metal 16 is formed on the barrier metal 15 so that a portion of the underbump metal 16 is provided in the opening portion 14x. The solder bump 17 is formed on the underbump metal 16.

Here, the first coating layer 41 is baked under the conditions of the baking temperature X1 and the bake time T1, under the conditions of the baking temperature X2 and the bake time T2, and under the conditions of the baking temperature X3 and the bake time T3. The second coating layer 42 is baked under the conditions of the baking temperature X2 and the bake time T2 and under the conditions of the baking temperature X3 and the bake time T3. The third coating layer 43 is baked under the conditions of the baking temperature X3 and the bake time T3. Hence, the second polyimide layer 14B is softer than the first polyimide layer 14A, and the first polyimide layer 14A has a higher strength than the second polyimide layer 14B. Similarly, the third polyimide layer 14C is softer than the second polyimide layer 14B, and the second polyimide layer 14B has a higher strength than the third polyimide layer 14C.

As a result of making baking temperature X2 higher than the baking temperature X3 and the baking temperature X1 higher than the baking temperature X2, the third polyimide layer 14C is made softer than the second polyimide layer 14B and the second polyimide layer 14B is made softer than the first polyimide layer 14A. For instance, the baking temperature X1 may be set to 380° C., the baking temperature X2 to 350° C. and the baking temperature X3 to 320° C.

As a result of making the bake time T2 longer than the bake time T3 and the bake time T1 longer than the baking time T2, the second polyimide layer 14B is softer than the first polyimide layer 14A, and the third polymer layer 14C is softer than the second polyimide layer 14B.

The polyimide multilayer 14 can include one or more other polyimide layers in addition to the first polyimide layer 14A, the second polyimide layer 14B and the third polyimide layer 14C.

What is claimed is:

1. A semiconductor device comprising:
an uppermost metal layer;
a solder bump;
metal which connects the uppermost metal layer and the solder bump; and
a polyimide multilayer having formed therein an opening portion in which the metal is provided, wherein
the polyimide multilayer includes:
a first polyimide layer; and
a second polyimide layer formed on the first polyimide layer, and
the second polyimide layer is softer than the first polyimide layer and the first polyimide layer has a higher strength than the second polyimide layer.

2. The semiconductor device according to claim 1, wherein
the polyimide multilayer includes a third polyimide layer formed on the second polyimide layer, and
the third polyimide layer is softer than the second polyimide layer.

3. The semiconductor device according to claim 1, wherein the second polyimide layer has a lower elastic modulus than the first polyimide layer.

4. The semiconductor device according to claim 2, wherein the third polyimide layer has a lower elastic modulus than the second polyimide layer.

* * * * *